(12) United States Patent
Meitl et al.

(10) Patent No.: US 10,475,773 B2
(45) Date of Patent: Nov. 12, 2019

(54) METHOD FOR PRODUCING A SEMICONDUCTOR COMPONENT AND A SEMICONDUCTOR COMPONENT

(71) Applicants: OSRAM Opto Semiconductors GmbH, Regensburg (DE); X-Celeprint Limited, Cork (IE)

(72) Inventors: Matthew Meitl, Durham, NC (US); Christopher Bower, Raleigh, NC (US); Tansen Varghese, Regensburg (DE)

(73) Assignees: OSRAM Opto Semiconductors GmbH, Regensburg (DE); X-Celeprint Limited, Cork (IE)

( * ) Notice: Subject to any disclaimer, the term of this patent is extended or adjusted under 35 U.S.C. 154(b) by 0 days.

(21) Appl. No.: 15/875,955

(22) Filed: Jan. 19, 2018

(65) Prior Publication Data

US 2018/0145058 A1 May 24, 2018

Related U.S. Application Data

(62) Division of application No. 15/009,744, filed on Jan. 28, 2016, now Pat. No. 9,887,180.

(Continued)

(51) Int. Cl.
*H01L 25/075* (2006.01)
*H01L 33/00* (2010.01)
(Continued)

(52) U.S. Cl.
CPC ...... *H01L 25/0753* (2013.01); *H01L 33/0079* (2013.01); *H01L 33/0095* (2013.01);
(Continued)

(58) Field of Classification Search
None
See application file for complete search history.

(56) References Cited

U.S. PATENT DOCUMENTS 6,197,609 B1  3/2001  Tsutsui et al.
7,964,884 B2  6/2011  Lee
(Continued)

FOREIGN PATENT DOCUMENTS

CN  101084583 A  12/2007
CN  102012269 A  4/2011
(Continued)

OTHER PUBLICATIONS

Kim, H., et al., "Unusual Strategies for Using Indium Gallium Nitride Grown on Silicon (111) for Solid-State Lighting," Proceedings of the National Academy of Sciences of the United States of America, vol. 108, No. 25, Jun. 21, 2011, pp. 10072-10077.

*Primary Examiner* — Anthony Ho
*Assistant Examiner* — Kevin Quinto
(74) *Attorney, Agent, or Firm* — Slater Matsil, LLP

(57) ABSTRACT

A method for producing a plurality of semiconductor components and a semiconductor component are disclosed. In an embodiment the component includes a light transmissive carrier, a semiconductor body disposed on the light transmissive carrier, the semiconductor body including a first semiconductor layer, a second semiconductor layer and an active region being arranged between the first semiconductor layer and the second semiconductor layer, wherein the semiconductor body includes a first patterned main surface facing the light transmissive carrier and a second main surface facing away from the carrier and a contact structure including a first contact area and a second contact area arranged on the second main surface, wherein the second contact area is electrically connected to the second semiconductor layer, and wherein the contact structure comprises a via extending from the second main surface throughout the second semiconductor layer and the active region into the first semiconductor layer.

20 Claims, 9 Drawing Sheets

Related U.S. Application Data

(60) Provisional application No. 62/110,358, filed on Jan. 30, 2015.

(51) Int. Cl.

| | | |
|---|---|---|
| *H01L 33/50* | (2010.01) | |
| *H01L 33/44* | (2010.01) | |
| *H01L 21/78* | (2006.01) | |
| *H01L 33/56* | (2010.01) | |
| *H01L 33/22* | (2010.01) | |
| *H01L 33/38* | (2010.01) | |
| *H01L 33/60* | (2010.01) | |

(52) U.S. Cl.
CPC ............ *H01L 33/44* (2013.01); *H01L 33/505* (2013.01); *H01L 33/507* (2013.01); *H01L 21/7806* (2013.01); *H01L 33/0066* (2013.01); *H01L 33/22* (2013.01); *H01L 33/382* (2013.01); *H01L 33/502* (2013.01); *H01L 33/508* (2013.01); *H01L 33/56* (2013.01); *H01L 33/60* (2013.01); *H01L 2933/005* (2013.01); *H01L 2933/0016* (2013.01); *H01L 2933/0025* (2013.01); *H01L 2933/0091* (2013.01)

(56) References Cited

U.S. PATENT DOCUMENTS

| | | | |
|---|---|---|---|
| 8,247,771 B2 | 8/2012 | Ouvrier-Buffet | |
| 8,928,020 B2 | 1/2015 | Kojima et al. | |
| 9,287,447 B2 | 3/2016 | Baike et al. | |
| 9,614,127 B2 | 4/2017 | Huang et al. | |
| 2003/0102473 A1* | 6/2003 | Chason | ............ H01L 21/02422 257/43 |
| 2006/0043399 A1 | 3/2006 | Miyagaki et al. | |
| 2006/0193355 A1* | 8/2006 | Tazima | ................. H01L 33/405 372/31 |
| 2008/0210955 A1 | 9/2008 | Uemura et al. | |
| 2010/0186883 A1 | 7/2010 | Tomoda | |
| 2010/0213485 A1 | 8/2010 | McKenzie et al. | |
| 2012/0112226 A1 | 5/2012 | Grolier et al. | |
| 2014/0203314 A1* | 7/2014 | Kojima | ................. H01L 33/504 257/98 |
| 2015/0111326 A1* | 4/2015 | Tischler | ................. H01L 33/508 438/27 |

FOREIGN PATENT DOCUMENTS

| | | |
|---|---|---|
| CN | 103311395 A | 9/2013 |
| CN | 103730480 A | 4/2014 |
| CN | 103887218 A | 6/2014 |
| CN | 104183675 A | 12/2014 |
| DE | 102008039790 A | 3/2010 |
| EP | 2757603 A1 | 7/2014 |
| JP | 2006066449 A | 3/2006 |
| JP | 2006237467 A | 9/2006 |
| JP | 2008047850 A | 2/2008 |
| JP | 2008518436 A | 5/2008 |
| JP | 2008140871 A | 6/2008 |
| JP | 2008186959 A | 8/2008 |
| JP | 2010177390 A | 8/2010 |
| JP | 2012195435 A | 10/2012 |
| JP | 2012525690 A | 10/2012 |
| JP | 2013183020 A | 9/2013 |
| JP | 2014067876 A | 4/2014 |
| JP | 2014139998 A | 7/2014 |
| JP | 2014216588 A | 11/2014 |
| JP | 2014229822 A | 12/2014 |
| JP | 2015012185 A | 1/2015 |
| WO | 2006043796 A1 | 4/2006 |
| WO | 2015000182 A1 | 1/2015 |

* cited by examiner

METHOD FOR PRODUCING A SEMICONDUCTOR COMPONENT AND A SEMICONDUCTOR COMPONENT

CROSS-REFERENCE TO RELATED APPLICATIONS

This is a divisional application of U.S. patent application Ser. No. 15/009,744 filed Jan. 28, 2016 and issued as U.S. Pat. No. 9,887,180 on Feb. 6, 2018, which claims the benefit of U.S. Provisional Application No. 62/110,358, filed on Jan. 30, 2015, both of which are incorporated herein by reference.

TECHNICAL FIELD

The invention relates to a method for producing a semiconductor component and to a semiconductor component.

BACKGROUND

Area lighting using LEDs necessitates a large number of small LEDs to be die bonded on a carrier. This is time-consuming and expensive when using standard methods for producing the LEDs and using standard die bonding techniques.

SUMMARY

Embodiments of the invention provide a particularly flexible method for producing a semiconductor component or a plurality of semiconductor components. Further embodiments provide a semiconductor component which can be produced in a simplified and cost-effective manner.

According to at least one embodiment of a method for producing a semiconductor component or a plurality of semiconductor components, a substrate is provided. The substrate can be patterned or flat. For example the substrate is radiation-transmissive, in particular transparent. The substrate is, for example, a growth substrate, which may in this case consist inter alia of sapphire or silicon or contain sapphire or silicon.

According to at least one embodiment of the method for producing the semiconductor component, a semiconductor layer sequence having a first semiconductor layer, a second semiconductor layer and an active region is applied, for instance is grown epitaxially, onto the substrate.

The semiconductor layer sequence comprises a first main surface facing the substrate and a second main surface facing away from the substrate. The first main surface, for example, faces a surface of the substrate. The surface of the substrate may be patterned, so that the first main surface is also patterned. In particular, the first main surface reproduces a patterned surface of the substrate facing the semiconductor layer sequence. The first and second main surfaces in particular delimit the semiconductor layer sequence in a vertical direction. A vertical direction is understood to mean a direction which is directed transversely, for instance perpendicularly, to a main extension plane of the active region. A lateral direction extends in parallel to the main extension plane of the active region. In particular, the lateral direction and the vertical direction are perpendicular to each other.

For example, the first semiconductor layer is formed as an n-conductive layer and the second semiconductor layer is formed as a p-conductive layer, or vice versa. The active region is disposed for instance between the first semiconductor layer and the second semiconductor layer. In particular, the active region is a pn-junction zone which is provided for generating or detecting electromagnetic radiation during the operation of the semiconductor component.

The semiconductor layer sequence is based, for example, on a III-V compound semiconductor material, which comprises at least one element from main group III, such as for example Al, Ga, In, and one element from main group five, such as for example N, P, As. In particular, the term "III-V compound semiconductor material" encompasses the group of binary, ternary and quaternary compounds, which contain at least one element from main group III and at least one element from main group five, for example, nitride and phosphide compound semiconductors. N-conductive and p-conductive layers may respectively be produced by appropriate doping of the semiconductor material. The semiconductor layer sequence may also be based on a II-VI compound semiconductor material.

According to at least one embodiment of the method, a contact structure comprising at least a first contact area, a second contact area and a via is formed on the side of the second main surface. The via is electrically connected for instance to the first contact area. For electrically contacting the first semiconductor layer, the via may extend from the second main surface throughout the second semiconductor layer and the active region into the first semiconductor layer. It is also possible that the via also extends throughout the first semiconductor layer. The second contact area is electrically connected for instance to the second semiconductor layer.

According to at least one embodiment, the semiconductor layer sequence is structured into a plurality of semiconductor bodies. The semiconductor layer sequence may be divided into a plurality of semiconductor bodies, for example, by forming at least one or a plurality of trenches separating the semiconductor bodies in the lateral direction.

Structuring the semiconductor layer sequence may proceed, for example, by means of an etching and/or a laser separation method, so that at least one mesa trench or a plurality of trenches is formed. The trench may extend from the second main surface, remote from the substrate, of the semiconductor layer sequence as far as into the first semiconductor layer or as far as the substrate or as far as into the substrate. The trench may be formed such that a bottom surface of the trench is formed by surfaces of the first semiconductor layer and/or of the substrate. After structuring the semiconductor layer sequence, the semiconductor bodies are in particular electrically insulated from one another.

According to at least one embodiment, an insulating layer is applied onto the structured semiconductor layer sequence, wherein the insulating layer covers the trench or the plurality of trenches and vertical surfaces of the semiconductor bodies. The insulating layer can be a dielectric layer which contains for instance silicon such as silicon oxide or silicon nitride. The insulating layer can be applied to the semiconductor bodies, for example, by sputtering or coating such as chemical or physical vapor deposition.

According to at least one embodiment, a plurality of tethers is formed by structuring the insulating layer in the region covering the trench. In particular, the tethers are formed within the trench or trenches. In this case the tethers are arranged laterally from the active regions of the semiconductor bodies in plan view.

According to at least one embodiment, the substrate is locally detached from the semiconductor bodies.

Locally detaching the substrate from the semiconductor bodies means that the substrate then is free of a direct physical contact to the semiconductor bodies in particular at least in regions covered by the active regions or the first semiconductor layers of the semiconductor bodies. The semiconductor bodies, however, may be still connected to the substrate indirectly, for example, by means of the tethers arranged sideways from the semiconductor bodies.

The local detachment of the substrate may proceed after the forming of the tethers. During and after the step of locally detaching the substrate from the semiconductor bodies, the tethers are in particular attached directly or indirectly to the substrate. In this case, the semiconductor bodies may be held in place at least during the step of locally detaching the substrate. After the step of locally detaching the substrate from the semiconductor bodies, the substrate is detached from the semiconductor bodies and/or from the semiconductor layer sequence in particular at least in regions which are covered by the active regions of the semiconductor bodies. The substrate, however, is preferably attached to the tethers and/or to portions of the first semiconductor layer covered by the tethers. In this case, the semiconductor bodies are connected to the substrate preferably only indirectly by means of the tethers. Detaching the substrate from the semiconductor bodies may proceed, for example, by means of an etching method or of a laser lift-off method. Using a laser lift-off method, radiation is introduced, for example, throughout the substrate, so that a separation zone may be decomposed and the semiconductor bodies can be detached from the substrate.

According to at least one embodiment, at least one semiconductor body having one first semiconductor layer, one second semiconductor layer and one active region together with one associated contact structure is selectively picked out by separating the tethers from the substrate. Separating the tethers from the substrate may be performed by mechanically breaking the tethers or by releasing or dissolving the tethers from the substrate. The at least one semiconductor body may be then separated completely from the substrate and transferred to a carrier, such as an interposer or a final board. The semiconductor body, which is mechanically connected to the substrate in particular only by means of the tethers, may be selectively removed by a stamp attached to the semiconductor body on the side of its second main surface. By lifting away the semiconductor body from the substrate, the tethers attaching the semiconductor body to the substrate can be mechanically broken or released, so that the semiconductor body is separated completely from the substrate. It is also possible that a plurality of the semiconductor bodies is selectively removed simultaneously or one after another from the substrate.

In accordance with at least one embodiment of a method for producing a plurality of semiconductor components each having a semiconductor body, a semiconductor layer sequence is applied on a substrate, wherein the semiconductor layer sequence comprises a first semiconductor layer, a second semiconductor layer and an active region being disposed between the first and the second semiconductor layers. A contact structure is formed for electrically contacting the first semiconductor layer and the second semiconductor layer.

For electrically contacting the first semiconductor layer, by way of example, the contact structure comprises at least one via or a plurality of vias extending throughout the second semiconductor layer and the active region. The semiconductor layer sequence is structured into a plurality of semiconductor bodies by forming at least one trench or a plurality of trenches separating the semiconductor bodies. An insulating layer is applied onto the semiconductor layer sequence to cover the trench or the plurality of trenches and vertical surfaces of the semiconductor bodies. In a next step, a plurality of tethers is formed by structuring the insulating layer in regions covering the trench or the plurality of trenches. After forming the tethers, the substrate is locally detached from the semiconductor bodies, while the tethers remain attached to the substrate. Each individual semiconductor body or a plurality of the semiconductor bodies may then be selectively picked up from the substrate by separating the tethers from the substrate, wherein the semiconductor body comprises one first semiconductor layer, one second semiconductor layer and one active region together with one associated contact structure.

Using the tethers' binding to the growth substrate, wherein the tethers connected to the semiconductor bodies are formed after forming a plurality of trenches separating or isolating the semiconductor bodies from each other, each individual semiconductor body may be held in place by the tethers during the step of locally detaching the substrate from the semiconductor bodies. In a subsequent step, the semiconductor bodies may be selectively picked up, for example, by a stamp, by breaking or releasing the tethers from the substrate. The semiconductor bodies can be transferred one after the other or in a large number simultaneously to a carrier, such as an interposer or a final board.

According to at least one embodiment, the semiconductor body or a plurality of semiconductor bodies are printed in a downward emitting configuration on a transparent carrier. A downward emitting configuration means that the semiconductor body is arranged on the carrier in such a way that its radiation passage area faces the carrier. For example, the semiconductor body is applied onto a connecting layer disposed on the carrier. The connecting layer may be an adhesive layer and/or an epoxy layer which, for example, is cured after printing the semiconductor body. The tethers or remnants of the broken tethers may serve as lateral anchoring structures additionally enhancing the mechanical stability of the connection between a semiconductor body and the carrier.

According to at least one embodiment, the insulating layer is structured so that the tethers associated with different semiconductor bodies are disconnected. It is also possible that at least an anchor bar is formed between the semiconductor bodies by structuring the insulating layer in the region covering the trench or the plurality of trenches, wherein the semiconductor bodies are connected to the anchor bar by the tethers. The anchor bar, for example, extends along at least one trench separating the semiconductor bodies. The anchor bar additionally contributes to hold the semiconductor bodies in place during the step of separating the substrate from the semiconductor bodies.

According to at least one embodiment, at least one trench is formed throughout the second semiconductor layer as well as the active region into the first semiconductor layer of the semiconductor layer sequence, so that a bottom surface of the trench is formed at least partially by a surface of the first semiconductor layer. Within the trench, the insulating layer may be formed to cover the first semiconductor layer. In this case, the tethers may be formed by structuring the insulating layer and in particular also the first semiconductor layer, such that in plan view, the tethers cover the first semiconductor layer within the trench or trenches. It is also possible that the insulating layer within the trench or trenches is structured into a plurality of tethers and anchor bars, wherein the anchor bars may cover also the first semiconductor layer within the trench or trenches. In this way, the first semiconductor layer within the trench or trenches increases the mechanical strength of the tethers and anchor bars.

According to at least one embodiment, at least one trench or a plurality of trenches is formed throughout the semiconductor layer sequence, such that a surface, in particular a patterned surface, of the substrate is partially exposed within the trench or trenches. By applying the insulating layer covering the trench or the plurality of trenches, the insulating layer may penetrate into the patterned substrate such that the insulating layer and the tethers to be formed are anchored to the substrate. An interface between the substrate and the insulating layer is enlarged due to the patterned surface of the substrate, so that an adhesion area for the tethers and/or for the anchor bars on the patterned surface is increased.

According to at least one embodiment, the substrate is locally detached from the semiconductor bodies by a laser lift-off process. The substrate, for example, is formed by a material which is radiation-transmissive, in particular transparent for a radiation used by the laser lift-off process. The substrate, for example, contains gallium nitride or silicon carbide or sapphire. The radiation may be targeted specifically onto the semiconductor bodies. Furthermore, due to different absorption coefficients of the material the semiconductor bodies and of the material of the tethers and/or of the anchor bars, the semiconductor bodies may be separated from the substrate while leaving the tethers and/or the anchor bars remaining attached to the substrate. Hence, using a laser lift-off process, the semiconductor bodies can be selectively locally detached from the substrate in a simplified way.

According to at least one embodiment, the substrate is locally detached from the semiconductor bodies by means of an etching method. The semiconductor bodies may be under-etched by a wet etchant. In particular, a directional etching method is used for separating the substrate from the semiconductor bodies. The tethers and the anchor bars may be designed to take advantage of the directional etching. The anchor bars can be formed in such a way that the substrate is etched only in a lateral direction being parallel to the anchor bars and is not etched along a lateral direction which is perpendicular to the anchor bars. The substrate in this case may be formed of silicon. For the directional etching, wet etchants such as KOH may be used. In this way, the substrate may be locally detached from the semiconductor bodies, while the tethers remain attached to the substrate.

According to at least one embodiment, a combination of etching methods is used to locally detach the substrate form the semiconductor bodies and to pattern the first main surfaces of the semiconductor bodies facing the substrate. In this case, the semiconductor layer sequence may be grown onto an unpatterned, for example, a flat or a plane surface of the substrate, so that the first main surface of the semiconductor layer sequence may be unpatterned at first. After structuring the semiconductor layer sequence into a plurality of semiconductor bodies, the first main surfaces of the semiconductor bodies facing the substrate may be patterned for example by means of an etching method.

In particular, the patterning proceeds after the step of forming the plurality of tethers and prior to the step of picking up the semiconductor bodies from the substrate by separating the tethers. The patterning of the first main surfaces of the semiconductor bodies may be performed during the step of locally detaching the substrate from the semiconductor bodies or after the step of locally detaching the substrate and prior to the step of separating the tethers. It is possible that a single etchant is used for locally detaching the substrate from the semiconductor bodies and for the patterning of the main surfaces of the semiconductor bodies. For example, the etchant KOH may be used to detach the substrate containing silicon for instance and simultaneously may be used to pattern the first semiconductor layer containing gallium nitride for instance. It is also possible that a combination of two etching processes are used in sequence, namely for locally detaching the substrate at first and then for patterning the first main surfaces of the semiconductor bodies while being connected to the substrate by means of the tethers.

In accordance with at least one embodiment, the semiconductor component has a contact structure and a semiconductor body arranged on a light transmissive carrier, wherein the semiconductor body comprises a first semiconductor layer, a second semiconductor layer and an active region being arranged between the first semiconductor layer and the second semiconductor layer. The semiconductor body comprises a first patterned main surface facing the carrier and a second main surface facing away from the carrier. The contact structure comprises a first contact area and a second contact area arranged on the side of the second main surface, wherein the second contact area is electrically connected to the second semiconductor layer. The contact structure comprises a via being electrically connected to the first contact area and extends in vertical direction in particular from the second main surface throughout the second semiconductor layer and the active region into the first semiconductor layer. At least a vertical surface of the semiconductor body is covered by an insulating layer which comprises a tether or a remnant of the tether. Moreover, the semiconductor component is in particular free of a growth substrate.

Such a semiconductor component can be produced by the methods for producing a semiconductor component described herein. Therefore, features described in connection with the methods for producing a semiconductor component or a plurality of semiconductor components can also be used for the semiconductor component, and vice versa.

According to at least one embodiment, the component comprises a connecting layer which mechanically fixes the semiconductor body to the light transmissive carrier. The component comprises in particular at least one or a plurality of tethers or remnants of the tethers being arranged laterally from the semiconductor body and embedded in the connecting layer. The tether or remnant of the tether is in particular part of an insulating layer covering an vertical surface of the semiconductor body.

According to at least one embodiment, the component comprises a mirror layer which is arranged on the side of the second main surface of the semiconductor body. Furthermore, the semiconductor component may comprise a further mirror layer which, for example, is embedded into the light transmissive carrier. In particular, the further mirror is arranged sideway from the semiconductor body. In a plane view, the mirror layer and the further mirror layer are in particular free of overlaps. The light transmissive carrier may comprise a plurality of such further mirror layers.

According to a preferred embodiment, the active region is configured to generate electromagnetic radiation during operation of the semiconductor component. The electromagnetic radiation may be coupled out from the semiconductor component at a surface of the light transmissive carrier. The efficiency of light out-coupling may be negatively affected by effects of total internal reflection at the surface of the light transmissive carrier. Electromagnetic radiation reflected back into the carrier, however, may be reflected by the further mirror layer back to a forward direction resulting in an increase of the efficiency of light out-coupling.

According to at least one embodiment, phosphor particles and/or scattering particles are disposed between the semiconductor body and a radiation passage area of the semiconductor component. The radiation passage area of the component may be formed by the surface of the light transmissive carrier, the surface being remote from the semiconductor body. Phosphor particles may absorb electromagnetic radiation emitted by the active region and re-emit an electromagnetic radiation having a longer peak wavelength in comparison with the electromagnetic radiation absorbed by the phosphor particles, so that the component may emit white light in total. The phosphor particles and/or the scattering particles may be disposed within the light transmissive carrier. Alternatively, the phosphor particles and/or the scattering particles may be embedded in a layer which is disposed between the carrier and the semiconductor body or on the side of the surface of the carrier being remote from the semiconductor body.

A plurality of the semiconductor bodies may be arranged on a single common light transmissive carrier, so that a device having a plurality of semiconductor components and a common light transmissive carrier is formed. The semiconductor bodies may be arranged in the form of a matrix having columns and rows on the single common light transmissive carrier. The common light transmissive carrier may comprise a plurality of further mirror layers, wherein the further mirror layers in each case may be arranged between two neighbouring columns or rows of the semiconductor bodies.

BRIEF DESCRIPTION OF THE DRAWINGS

For a more complete understanding of embodiments of the present invention, and the advantages thereof, reference is now made to the following descriptions taken in conjunction with the accompanying drawings, in which.

Figure 1:
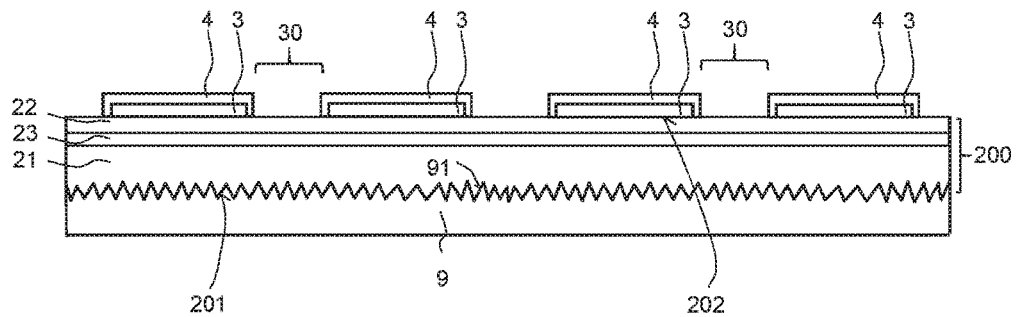
FIG. 1 shows a schematic sectional view of a substrate with a mirror layer and a connection layer according to an embodiment.

Identical or similar elements, or elements acting in an identical manner, are provided with the same reference numerals in the figures. In each case, the figures are schematic views and are therefore not necessarily true to scale. Rather, comparatively small elements, and in particular layer thicknesses, may be illustrated excessively large for clarification purposes.

DETAILED DESCRIPTION OF ILLUSTRATIVE EMBODIMENTS

In FIG. 1, a substrate 9 is provided. The substrate 9 has a surface 91 which is patterned. It is also possible that the surface 91 of the substrate 9 is not patterned and is formed as a flat surface. The substrate 9 is, for example, radiation-transmissive, in particular transparent for electromagnetic radiation in visible, infrared and/or ultraviolet spectral ranges. The substrate 9 may comprise gallium nitride or silicon carbide or sapphire. Alternatively, the substrate 9 can be radiation-opaque. In this case, the substrate 9 may be a silicon substrate.

A semiconductor layer sequence 200 is applied onto the surface 91 of the substrate 9. The semiconductor layer sequence 200 comprises a first semiconductor layer 21, a second semiconductor layer 22 and an active region 23 which is disposed between the first semiconductor layer 21 and the second semiconductor layer 22. The first semiconductor layer 21 may be an n-conductive layer and the second semiconductor layer 22 may be a p-conductive layer, or vice versa. The active region 23, for example, is configured for generating electromagnetic radiation or for absorbing and transforming electromagnetic radiation into electrical signals or energy.

The semiconductor layer sequence 200 may be grown epitaxially on the substrate 9. The semiconductor layer sequence 200 has a first main surface 201 facing the substrate 9 and a second main surface 202 which is remote from the substrate 9. The first main surface 201 is patterned which may be formed by a surface of the first semiconductor layer 21 facing substrate 9. A patterned substrate 9 may improve the quality of the epitaxial semiconductor layers of the semiconductor layer sequence 200. Moreover, the semiconductor layer sequence 200 may be grown onto the patterned surface 91 of the substrate 9, such that the first patterned main surface 201 reproduces the patterned surface 91 of the substrate 9.

A mirror layer 3 is deposited onto the second main surface 202 remote from the substrate 9. The mirror layer 3 comprises a plurality of sub-regions being laterally separated from one another. In particular, the mirror layer 3 comprises a plurality of openings 30. Each of the sub-regions of the mirror layer 3 may be continuous and comprises, for instance, at least one of the openings 30 of the mirror layer 3.

The mirror layer 3 is in particular electrically conductive. In top view, the mirror layer 3 is covered by a connection layer 4 which is, for example, also electrically conductive. The mirror layer 3 and/or the connection layer 4 may contain a metal such as aluminium, rhodium, palladium, silver, gold or platinum or alloys of these elements.

Figure 2:
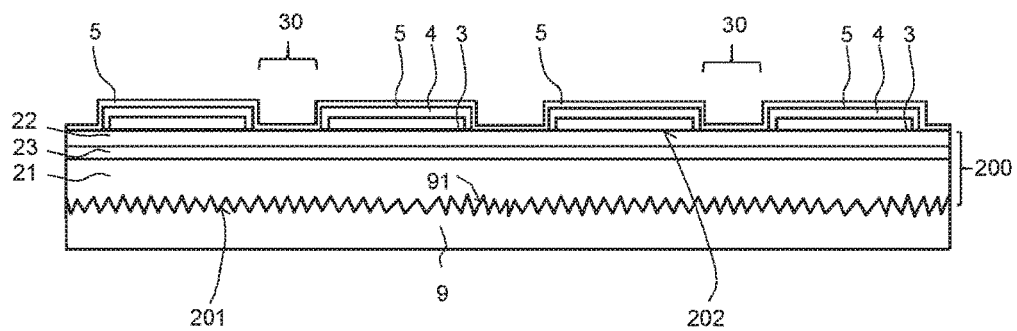
FIG. 2 shows a schematic sectional view of the substrate with a dielectric layer according to an embodiment.

In FIG. 2, a dielectric layer 5, for example, a silicon nitride layer or a silicon oxide layer, is applied on the semiconductor layer sequence 200, wherein the dielectric layer 5 covers the connection layer 4 and in particular the semiconductor layer sequence 200 completely.

Figure 3:
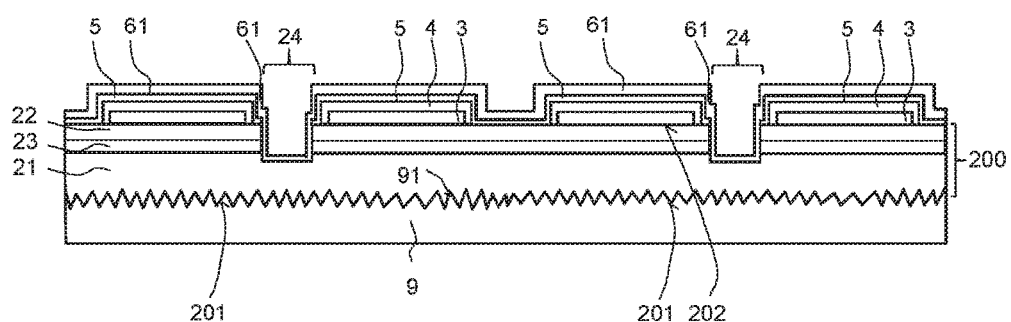
FIG. 3 shows a schematic sectional view of the substrate with a passivation layer and a plurality of recesses according to an embodiment.

In FIG. 3, a plurality of recesses 24 are formed in regions of the openings 30 of the mirror layer 3. In vertical direction, each recess 24 extends throughout the dielectric layer 5, the second semiconductor layer 22, the active region 23 into the first semiconductor layer 21. The recess 24 forms a blind hole in the semiconductor layer sequence 200, wherein in lateral direction the recess 24 is surrounded by the semiconductor layer sequence 200 for instance completely. The recesses 24 may be formed by an etching method, for example, by a dry etching method.

After forming the recesses 24, a passivation layer 61, for example, a silicon oxide layer such as $SiO_2$ or a silicon nitride layer, is formed to cover vertical surfaces of the recesses 24. It is possible that the passivation layer 61 covers the recesses 24 and the dielectric layer 5 completely. In a subsequent step, the passivation layer 61 may be partially removed. The passivation layer 61 and the dielectric layer 5 preferably comprise different dielectric materials. By way of example, the dielectric layer 5 contains or mainly consists of silicon nitride and the passivation layer 61 contains or mainly consists of silicon oxide.

Figure 4:
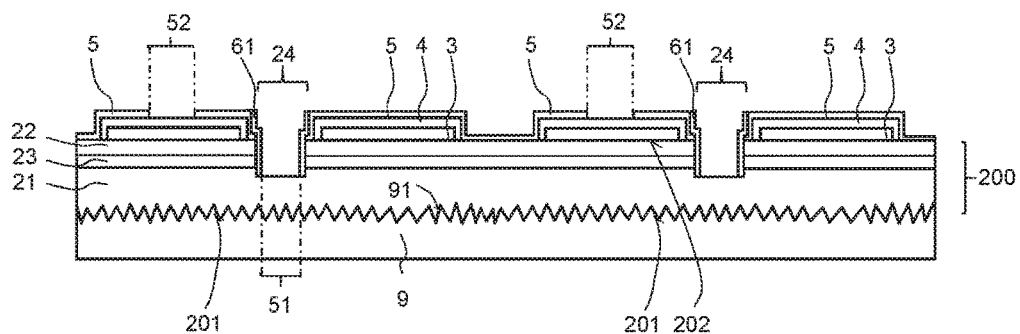
FIG. 4 shows a schematic sectional view of the substrate with a plurality of openings in the passivation layer and the dielectric layer and a trench forming semiconductor bodies according to an embodiment.

In FIG. 4 the passivation layer 61 is partially removed, for example, by etching, such that the first semiconductor layer 21 is exposed in the regions of the recesses 24. By partially removing the passivation layer 61, the dielectric layer 5 is also at least partially exposed. In a next step, the dielectric layer 5 is removed, for example, by etching, in places such that the dielectric layer 5 comprises in addition to first openings 51 in the regions of the recesses 24, a plurality of second openings 52 arranged laterally to the recesses 24. In the second openings 52, an electrically conductive layer such as the connection layer 4 is partially exposed.

Figure 5:
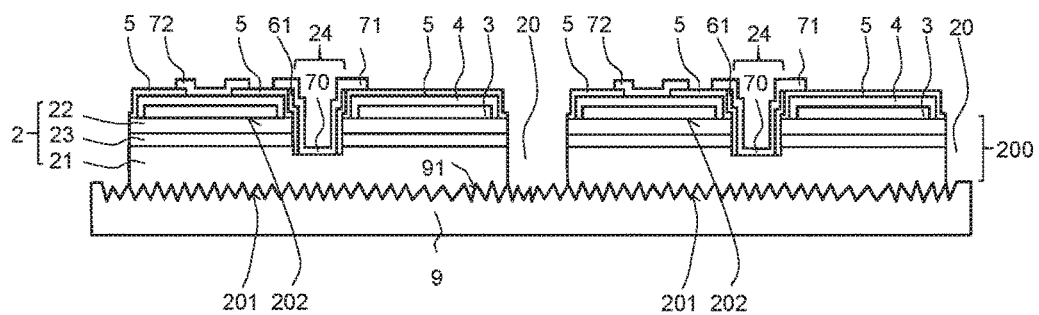
FIG. 5 shows a schematic sectional view of the substrate with a plurality of contact areas formed in the openings and the recesses according to an embodiment.

In FIG. 5, a contact structure 7 comprising a first contact area 71, a second contact area 72 and a via 70 is formed on the side of the second main surface 202 of the semiconductor layer sequence 200. The first contact area 71 and the second contact area 72 are laterally separated and in this way electrically isolated from each other. In vertical direction, the second contact area 72 extends through the second opening 52 of the dielectric layer 5 and is electrically connected to the second semiconductor layer 22 by means of the mirror layer 3 and the connection layer 4. The first contact area 71 is deposited outside the recess 24 and is electrically connected to the via 70, wherein the via 70 is arranged inside the recess 24. In vertical direction, the via 70 extends at least from the second main surface 202 throughout the second semiconductor layer 22 and the active region 23 into the first semiconductor layer 21. In particular for testing purposes, the semiconductor layer sequence 200 may be electrically connected to an external current source by means of the first and second contact area 71 and 72 arranged on the second main surface 202 remote from the substrate 9. Within the recess 24, in lateral direction, the via 70 is electrically isolated from the second semiconductor layer 22 and the active region 23 by means of the passivation layer 61 covering vertical surfaces of the recess 24.

In FIG. 5, the semiconductor layer sequence 200 is structured laterally into a plurality of semiconductor bodies 2. Lateral structuring means that the semiconductor layer sequence 200 is divided into a plurality of semiconductor bodies 2 being spaced laterally apart from one another. A mesa trench 20 or a plurality of trenches 20 are formed between the semiconductor bodies 2. In vertical direction, the trench 20 extends throughout the semiconductor layer sequence 200 as far as to the substrate, so that the surface 91, in particular the patterned surface 91, of the substrate 9 is partially exposed within the trench 20 or trenches 20. A bottom surface of the trench 20 may be formed by the patterned surface 91 of the substrate 9. The trenches 20 may be formed by an etching method, for instance by a dry, wet or laser etching method, in particular in regions between the sub-regions of the mirror layer 3. The trench 20 may also be formed sideways from the semiconductor layer sequence 200.

Figure 6A:
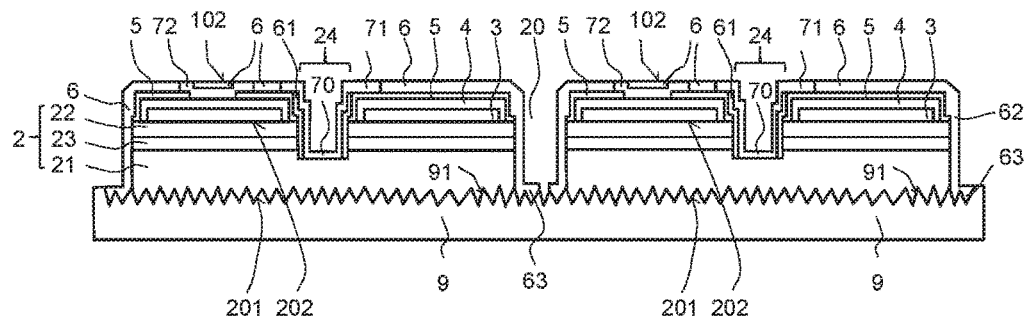
FIG. 6A shows a schematic sectional view of the substrate with an insulating layer disposed on the semiconductor bodies according to an embodiment.

In FIG. 6A, an insulating layer 6 is applied onto the semiconductor bodies 2 and onto the substrate 9, wherein the insulating layer 6 covers vertical surfaces of the semiconductor bodies 2 and the trench or trenches 20 arranged laterally to the semiconductor bodies 2. In particular, the insulating layer penetrates into the patterned substrate 9 such that the insulating layer 6 is anchored to the substrate 9 additionally due to the patterned surface 91 of the substrate 9. The insulating layer 6 may also be applied to cover the dielectric layer 5 and the contact structure 7, in particular the second contact area 72, such that a rear side 102 of the component is formed, wherein the rear side 102 is substantially flat, at least outside the recess or recesses 24. The rear side 102 is formed, for example, partially by surfaces of the insulating layer 6 and partially by surfaces of the first and second contact area 71 and 72. On the rear side 102, the first contact area 71 and the second contact area 72 are partially exposed and are electrically contactable.

After applying the insulating layer 6, a plurality of tethers 63 are formed by structuring the insulating layer 6 at least in a regions covering the trench 20 or trenches. The tethers 63 are, in particular, parts of the insulating layer 6 which are arranged laterally to their associated semiconductor body 2. In top view onto the substrate 9, the semiconductor body 2 preferably does not have any overlaps with the tethers 63.

The tethers 63 are formed to mechanically fix the semiconductor body 2 to the substrate 9. The tethers 63 may contain a dielectric material such as silicon nitride or silicon oxide, for example, silicon dioxide. For structuring the insulating layer 6 covering the trenches 20, a lithography process and/or an etching process may be used.

Figure 6B:
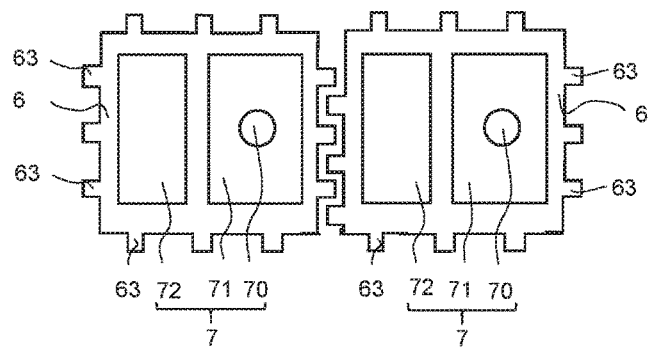
FIG. 6B shows a top view of a contact structure according to an embodiment.

In FIG. 6B, the contact structure 7 comprising the first contact area 71, the via 70 and the second contact area 72 on the rear surface 102 is shown. Vertical surfaces of each semiconductor body 2 are covered by the insulating layer 6. The insulating layer 6 is structured into a plurality of laterally separated insulating layers 6 associated with different semiconductor bodies 2. Each semiconductor body 2 comprises on its lateral sides at least one or a plurality of the tethers 63. The insulating layer 6 is structured in regions covering the trenches 20 in such a way that tethers 63 associated with different semiconductor bodies 2 are disconnected. This simplifies the process of lifting up any individual semiconductor body 2 without having influence on its neighboring semiconductor bodies 2.

Figure 6C:
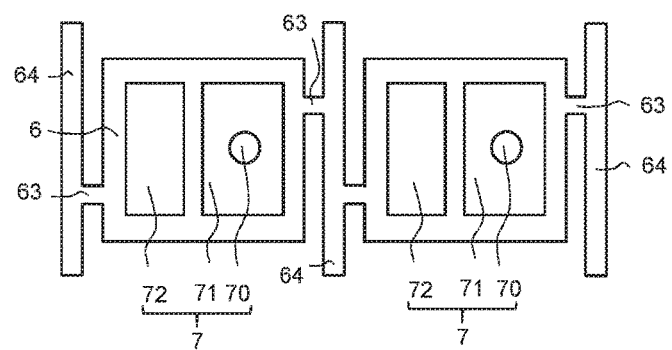
FIG. 6C shows a top view of a contact structure according to an embodiment.

In FIG. 6C, an anchor bar 64 is formed between the semiconductor bodies 2 by structuring the insulating layer 6 in the region covering the trench 20. By way of example, the anchor bar extends along a row of the semiconductor bodies 2 along a lateral direction. A plurality of anchor bars 64 may be formed in regions of the trenches 20 between the semiconductor bodies 2. The tethers 63 are connected to the anchor bar 64. In this case neighboring semiconductor bodies 2 may be mechanically connected to each other by the tethers 63 and the anchor bars 64. The tethers 63 and the anchor bars 64 may be designed to take advantage, for example, of a directional etching method which is used for locally detaching the substrate 9 from the semiconductor bodies 2.

Figure 7A:
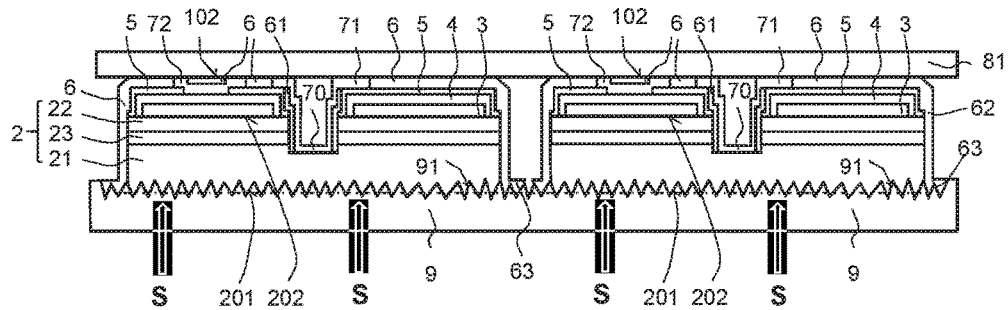
FIG. 7A shows a schematic sectional view of the substrate being separated from the semiconductor bodies according to an embodiment.

In FIG. 7A, the substrate 9 is separated from the semiconductor bodies 2. This can be performed by a laser lift-off process. Radiation S can be introduced into the semiconductor bodies 2, in particular into the first semiconductor layers 21 regionally through the substrate 9, such that the first semiconductor layers 21 of the semiconductor bodies 2, in particular of all semiconductor bodies 2 are locally detached from the substrate 9. During the step of separating the substrate 9 the semiconductor bodies 2 are held in place by the tethers 63 which remain attached to the substrate 9. Additionally, a stabilizing carrier 81 may be used which is attached to the rear sides 102 of the semiconductor bodies 2. After detaching the substrate 9 from the semiconductor bodies 2, the first semiconductor layers 21 of the semiconductor bodies 2 are preferably completely separated from the substrate 9, while the tethers 63 remain at least partially attached to the substrate 9.

Figure 7B:
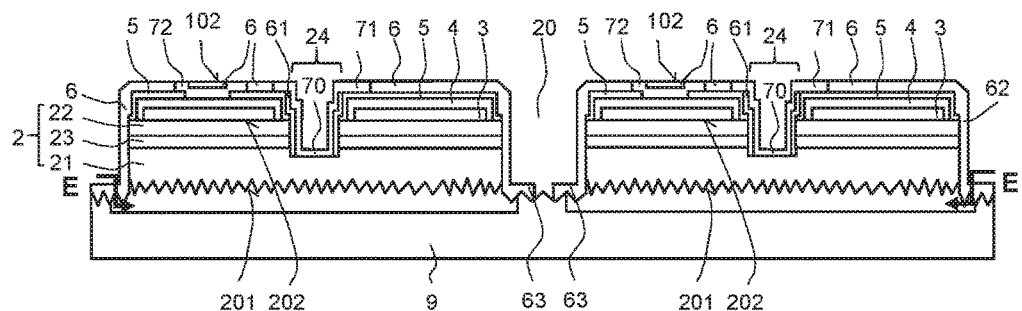
FIG. 7B shows a schematic sectional view of the substrate being separated from the semiconductor bodies according to an embodiment.

In FIG. 7B, an etching method may be used for detaching the substrate 9 from the semiconductor bodies 2. For example, the semiconductor body 2 is under-etched by a wet etchant E, which etches the surface 91 of the substrate 9 and/or the first main surface 201 of the semiconductor body 2. For example, a directional etching method is used, wherein the etchant only etches regions covered by the semiconductor body 2. In particular, the tethers 63 and/or the anchor bars 64 are not etched. For example, the substrate 9 is a silicon substrate. In this case, the tethers 63 and 64 are designed in such a way that the substrate 9 is not etched perpendicular to the anchor bars 64, that is etched only along a lateral direction parallel to the anchor bars 64. For example, a hot wet etchant such as KOH is used for directional etching of the silicon substrate along a direction parallel to the anchor bars 64. In particular, the wet etchant like KOH selectively etches the silicon substrate 9 along <$\overline{1}$10> directions and is arrested in <11$\overline{2}$> directions in a (11$\overline{1}$) plane.

Figure 7C:
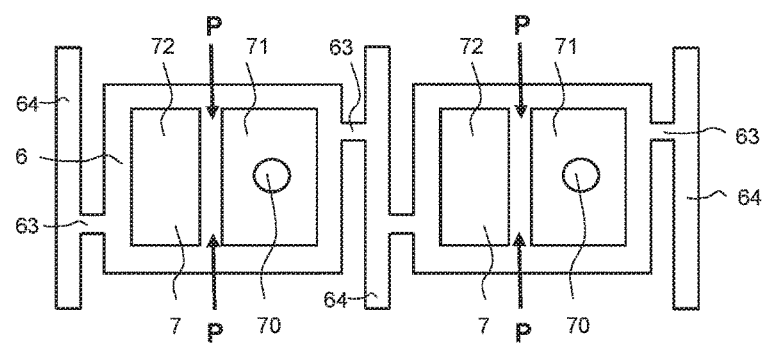
FIG. 7C shows a top view of a contact structure after separating the substrate from the semiconductor bodies according to an embodiment.

It is also possible to use an etchant which etches the first semiconductor layer 21 or both the first semiconductor layer 21 and the substrate 9. By under-etching the semiconductor bodies 2, the substrate 9 may be locally detached from the semiconductor bodies 2, wherein the tethers 63 and/or the anchor bars 64 remain at least partially attached to the substrate 9 (FIG. 7C). Using an etchant such as KOH, the first main surface 201 is patterned resulting in an optimal light extraction surface 201. It is also possible to use a combination of two etchants in sequence, one of which is used to etch the substrate 9 and the other etchant is used for patterning the first main surfaces 201 of the semiconductor bodies facing the substrate 9.

Figure 8A:
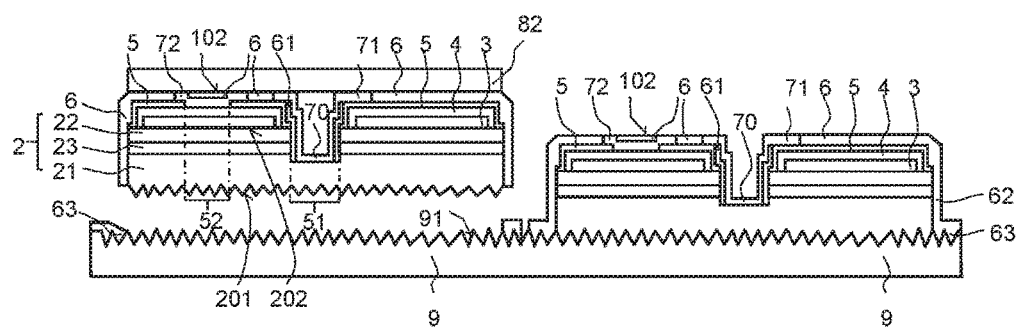
FIG. 8A shows a schematic sectional view of lifting off a semiconductor body from the substrate according to an embodiment.
Figure 8B:
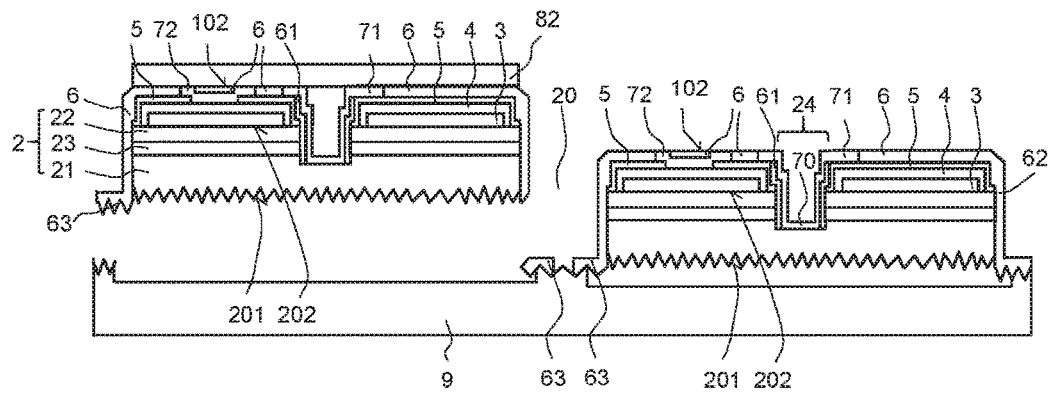
FIG. 8B shows a schematic sectional view of lifting off a semiconductor body from the substrate according to an embodiment.

In FIG. 8A, a stamp 82 is attached onto the rear side 102 after the stabilizing area 81 has been removed. One semiconductor body 2 having one first semiconductor layer 21, one second semiconductor layer 22 and one active region 23 together with the associated contact structure 7 having the via 70 may be selectively picked up by the stamp and lifted from the substrate 9 such that the tethers 63 are separated from the substrate 9. For instance, the tethers 63 are mechanically broken or released from the substrate 9. It is possible that the tethers 63, or at least some remnants of the tethers 63 are detached from the substrate (FIG. 8B), so that the insulating layer 6 still comprises the tethers 63 or at least some remnants of the tethers 63 after the semiconductor body 2 has been completely removed from the substrate 9. It is also possible to selectively pick up a plurality of semiconductor bodies 2 simultaneously.

Figure 9A:
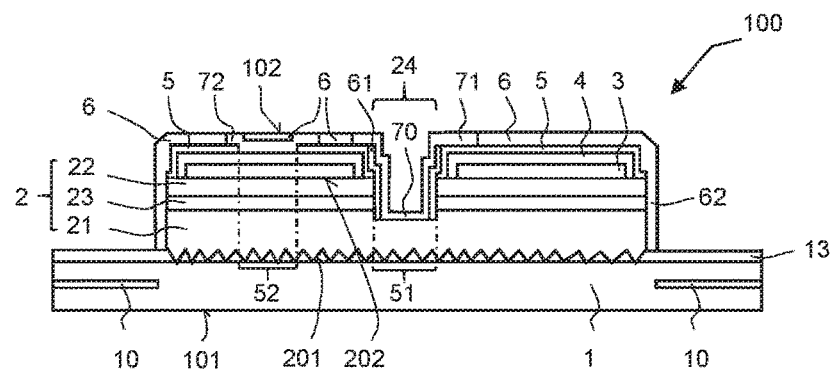
FIG. 9A shows a first exemplified embodiment of a semiconductor component.

In FIG. 9A the semiconductor body 2, together with the associated contact structure 7 is transferred to a carrier 1. The semiconductor body 2 is for instance printed onto the carrier 1 such that the patterned first main surface 201 faces the carrier 1. The first main surface 201 is in particular free of any electrical contacts. The carrier 1 is formed, for example, as a light transmissive carrier. The carrier 1 comprises a connecting layer 13 which is a transparent layer, for instance an adhesive or an epoxy layer. After applying the semiconductor body 2 on the carrier 1, the connecting layer 13 may be partially removed and cured. The connecting layer 13 fixes the semiconductor body 2 to the carrier 1. The carrier 1 comprises a further mirror 10 or a plurality of further mirrors 10 which may be embedded into the carrier 1. The semiconductor body 2 is arranged on the carrier 1 in a way such that the further mirror 10 or the further mirrors 10 are arranged sideways from the semiconductor body 2. In top view the mirror layer 3, which is disposed on the side of the second main surface 202 of the semiconductor body 2 and the further mirror layers 10 are in particular free of overlaps. After applying the semiconductor body 2 onto the carrier 1, the connecting layer 13 may be partially removed and cured. After removing the stamp 82, a semiconductor component 100 as shown in FIG. 9A may be electrically connected to an external electric source by means of the first contact area 71 and the second contact area 72 on the rear side 102 of the semiconductor component 100.

Figure 9B:
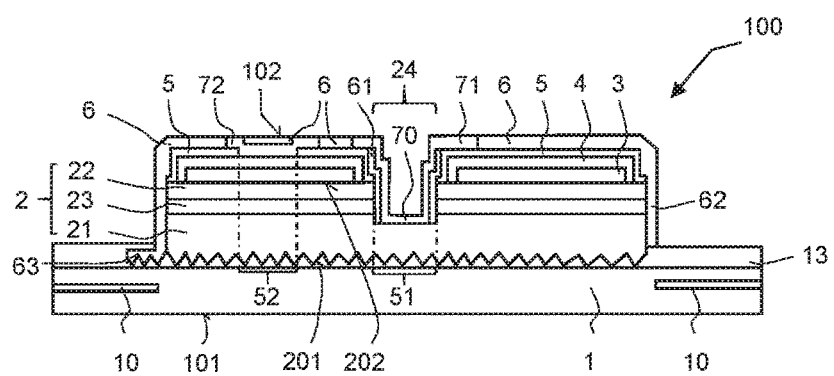
FIG. 9B shows a second exemplified embodiment of a semiconductor component.

FIG. 9B schematically illustrates a further exemplary embodiment of the semiconductor component 100. This embodiment corresponds substantially to the embodiment of the semiconductor component 100 in FIG. 9A. In contrast thereto, the insulating layer 6 comprises a tether 63 or remnant of the tether 63 which is embedded into the connecting layer 13. The tether 63 or remnant of the tether 63 may serve as an additional lateral anchoring structure which enhances the mechanical stability of the connection between the carrier 1 and the semiconductor body 2. It is also possible that the semiconductor component 100 comprises a plurality of tethers 63 or remnants of tethers 63 which are embedded in the connecting layer 13.

Figure 10:
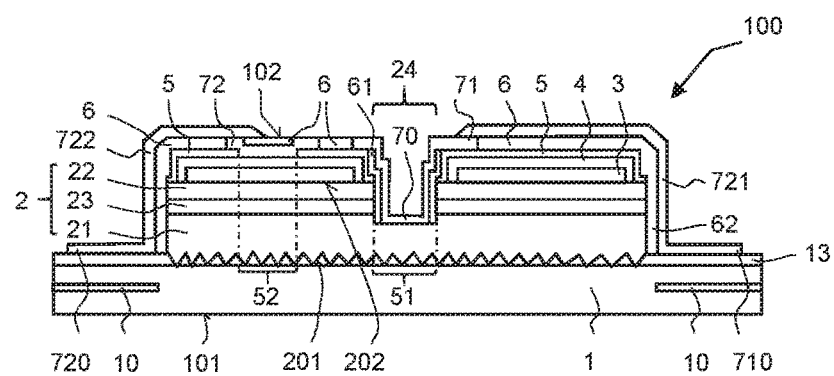
FIG. 10 shows a third exemplified embodiment of a semiconductor component.

FIG. 10 schematically illustrates a further exemplary embodiment of the semiconductor component which substantially corresponds to the embodiment in FIG. 9A. In contrast thereto, the contact structure 7 further comprises a first contact layer 710, a second contact layer 720, a first contact path 721 and a second contact path 722, wherein the first contact layer 710 and the second contact layer 720 are disposed laterally from the semiconductor body 2 on the carrier 1. The first contact layer 710 is electrically connected to the first contact area 71 by the first contact path 721 covering a vertical surface of the semiconductor body 2. The second contact layer 720 is electrically connected to the second contact area 72 by the second contact path 722 covering a vertical surface of the semiconductor body 2. It is also possible that the semiconductor component 100 is covered by an additional passivation layer (not shown) which covers, for example, parts of the contact structure 7.

Figure 11:
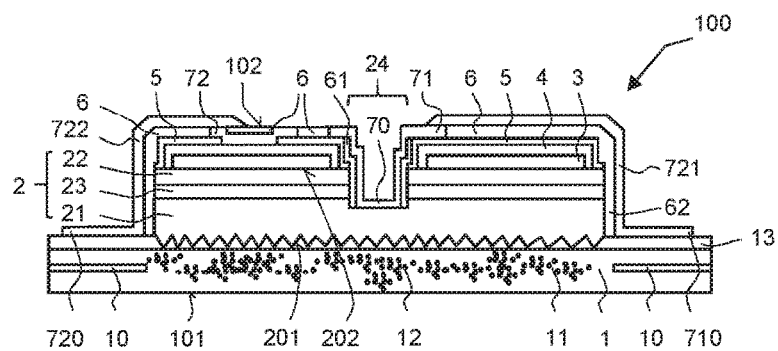
FIG. 11 shows an exemplified embodiment of a semiconductor component with phosphor and/or scattering particles embedded in the carrier.

In FIG. 11, the semiconductor component 100 comprises phosphor particles 11 and/or scattering particles 12. The phosphor particles 11 and/or the scattering particles 12 may be embedded into a main body of the carrier 1. The carrier 1 comprises a radiation passage area 101 on a side being remote from the semiconductor body 2. Electromagnetic radiation emitted by the active region 23 may be absorbed and re-emitted by the phosphor particles 11 and scattered by the scattering particles 12 before leaving the semiconductor component 100, for example, at the radiation passage area 101. It is also possible that the phosphor particles 11 and/or the scattering particles 12 are embedded into the connecting layer 13 or into a layer disposed between the semiconductor body 2 and the carrier 1 or disposed on the radiation passage area 101 of the carrier 1.

Figure 12:
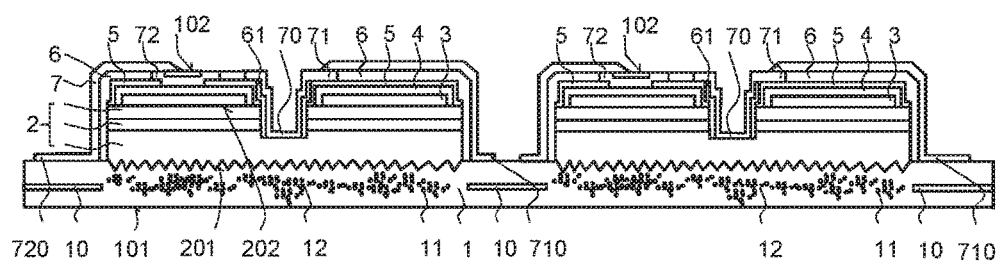
FIG. 12 shows an exemplified embodiment of a device comprising a plurality of semiconductor components.

FIG. 12 illustrates a device comprising a plurality of semiconductor components 100, wherein the carriers of all the semiconductor components 100 are formed as a single common light transmissive carrier 1. The semiconductor bodies 2 may be arranged in a plurality of rows and columns on the common light transmissive carrier 1. In particular, a plurality of semiconductor bodies 2 may be applied onto the common carrier 1 simultaneously or one after the other. The device may comprise a plurality of further mirror layers 10 which are embedded in the common carrier 1 and arranged between the columns and rows of the semiconductor bodies 2. By way of example, in top view, the mirror layers 3 of semiconductor bodies 2 and the further mirror layers 10 of the common carrier are free of overlaps.

FIGS. 13A to 13E illustrate some further steps of a method for producing a plurality of semiconductor components 100.

Figure 13A:
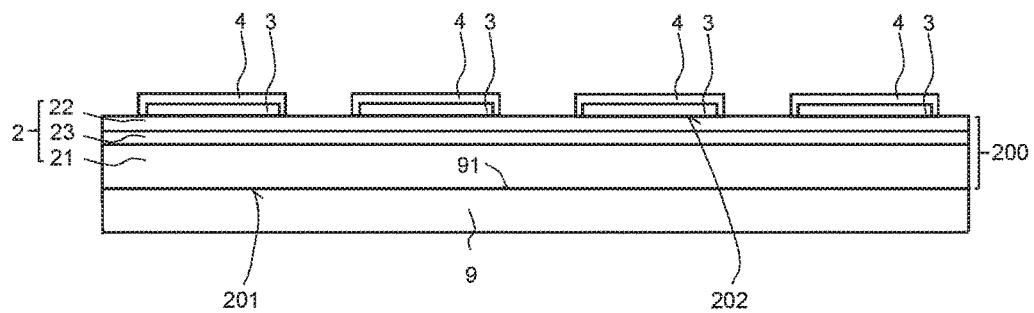
FIG. 13A shows a schematic sectional view illustrating a production step corresponding to FIG. 1 but with a substrate having a flat surface.

The production step illustrated in FIG. 13A corresponds essentially to the production step described in FIG. 1. In contrast thereto, the substrate 9 comprises a surface 91 which is not patterned but flat.

Figure 13B:
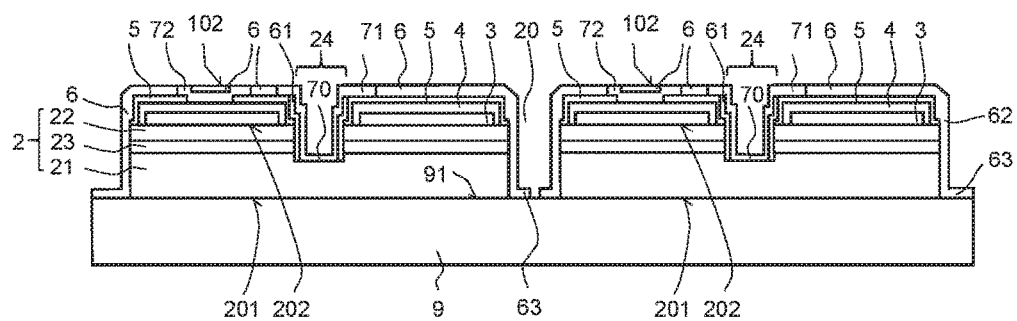
FIG. 13B shows a schematic sectional view illustrating a production step corresponding to FIG. 6A but with a substrate having a flat surface.

The production step illustrated in FIG. 13B corresponds substantially to the production step illustrated in FIG. 6A. In contrast thereto, the tethers 63 are formed on the flat surface 91 of the substrate 9.

Figure 13C:
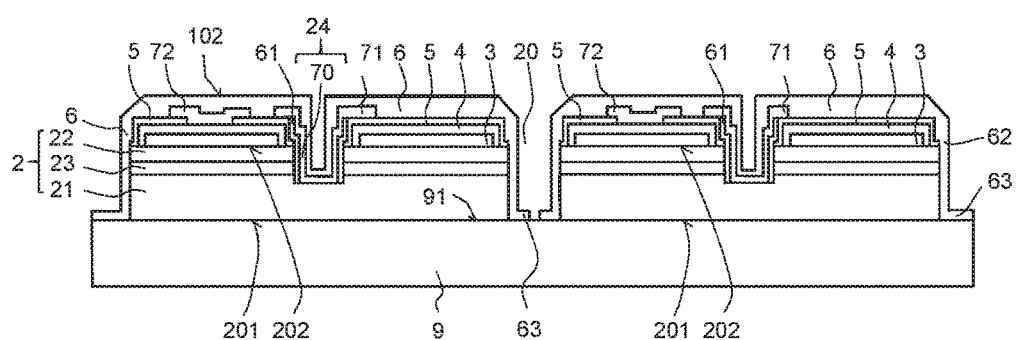
FIG. 13C shows a schematic sectional view illustrating a production step corresponding to FIG. 13B but with a different insulating layer.

The production step described in FIG. 13C corresponds substantially to the method step illustrated in FIG. 13B. In contrast thereto, the insulating layer 6 covers the first contact area 71, the second contact area 72 and the via 70 in particular completely, such that the rear side 102 is formed in particular only by an outer surface of the insulating layer 6. The rear side 102 can be formed especially flat in a simplified way, so that in following production steps the stabilizing carrier 81 or the stamp 82 may be easily attached to the semiconductor bodies 2 at the rear side 102. For electrically contacting the component 100, the insulating layer 6 may be removed partially, so that the first and the second contact area 71 and 72 are exposed at least partially.

Figure 13D:
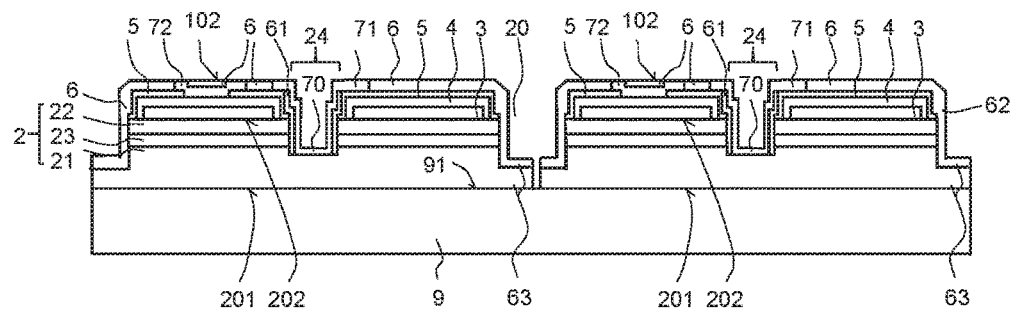
FIG. 13D shows a schematic sectional view illustrating a production step corresponding to FIG. 13B but with a different trench.

The production step illustrated in FIG. 13D corresponds substantially to the production step described in FIG. 13D. In contrast thereto, the trench 20 or a plurality of trenches 20 are formed in that way that their bottom surfaces are formed partially by exposed portions of the first semiconductor layer 21. The tethers 63 and/or the anchor bars 64 are formed in this case partially by the insulating layer 6 and partially by the first semiconductor layer 21. By doing so the mechanical strength of the tethers 63 and the anchor bars 64 is increased.

Figure 13E:
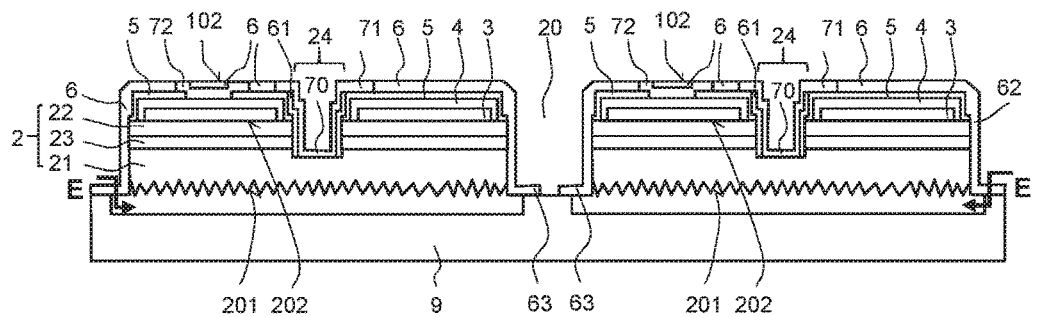
FIG. 13E shows a schematic sectional view illustrating a production step corresponding to FIG. 7B but with a sequence layer grown on a substrate having a flat surface.

The method step illustrated in FIG. 13E corresponds substantially to the method step described in FIG. 7B. In contrast thereto, the semiconductor layer sequence 200 has been grown onto a plane or flat surface 91 of the substrate 9, wherein the first main surfaces 201 of the semiconductor bodies 2 are patterned during or after the process of under-etching the semiconductor bodies 2 locally detaching them from the substrate 9. For detaching the substrate 9 from the semiconductor bodies 2 and for patterning the first main surfaces 201, one single etchant or a combination of at least two or more etchants may be used. The patterning of the first main surfaces 201 may be performed, while the semiconductor bodies 2 are still connected to the substrate 9 by means of the tethers 63.

Using tethers for binding semiconductor bodies to a growth substrate, wherein the tethers are formed within mesa trenches separating the semiconductor bodies, the semiconductor bodies may be held in place during the process of detaching the growth substrate, then selectively picked up and transferred to a carrier, wherein no extra release layers are needed. By using the tethers, the method for producing a plurality of semiconductor components may be simplified, resulting in a reduction of production costs.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A semiconductor component comprising:
a light transmissive carrier;
a semiconductor body disposed on the light transmissive carrier, the semiconductor body comprising a first semiconductor layer, a second semiconductor layer and an active region being arranged between the first semiconductor layer and the second semiconductor layer, wherein the semiconductor body comprises a first patterned main surface facing the light transmissive carrier and a second main surface facing away from the light transmissive carrier;
a contact structure comprising a first contact area and a second contact area arranged on the second main surface and a via, wherein the second contact area is electrically connected to the second semiconductor layer, and wherein the via is electrically connected to the first contact area and extends from the second main surface throughout the second semiconductor layer and the active region into the first semiconductor layer;

an insulating layer covering a vertical surface of the semiconductor body, wherein the insulating layer comprises a tether or a remnant of the tether, and wherein the semiconductor component is free of a growth substrate; and a connecting layer mechanically fixing the semiconductor body to the light transmissive carrier, wherein the tether or the remnant of the tether is embedded in the connecting layer, wherein the tether or the remnant of the tether is arranged sideways from the semiconductor body and is an additional lateral anchoring structure which enhances a mechanical stability of a connection between the light transmissive carrier and the semiconductor body.

2. The semiconductor component according to claim 1, further comprising a first mirror layer and a second mirror layer, wherein the first mirror layer is arranged on a side of the semiconductor body facing the second main surface, wherein the second mirror layer is embedded into the light transmissive carrier, wherein the second mirror layer is arranged sideways from the semiconductor body, and wherein the first mirror layer and the second mirror layer do not overlap.

3. The semiconductor component according to claim 1, wherein the active region is configured to generate electromagnetic radiation during operation of the semiconductor component.

4. The semiconductor component according to claim 1, wherein phosphor particles are disposed within the light transmissive carrier.

5. The semiconductor component according to claim 1, wherein phosphor particles are in a layer disposed on the light transmissive carrier.

6. A device comprising:
a plurality of the semiconductor components according to claim 1, wherein the light transmissive carriers of the semiconductor components are formed as a single common light transmissive carrier.

7. The semiconductor component according to claim 1, wherein the light transmissive carrier is an interposer or a final board, wherein, during operation of the semiconductor component, the active region is configured to generate electromagnetic radiation which is coupled out from the semiconductor component at a couple out surface of the light transmissive carrier, the couple out surface being remote from the semiconductor body.

8. The semiconductor component according to claim 1, wherein the semiconductor component has a downward emitting configuration and the semiconductor body is arranged on the light transmissive carrier such that its radiation passage area faces the light transmissive carrier and a radiation passage area of the semiconductor component is formed by a surface of the light transmissive carrier, the surface of the light transmissive carrier being remote from the semiconductor body.

9. A semiconductor component comprising:
a light transmissive carrier;
a semiconductor body disposed on the light transmissive carrier, the semiconductor body comprising a first semiconductor layer, a second semiconductor layer and an active region being arranged between the first semiconductor layer and the second semiconductor layer, wherein the semiconductor body comprises a first patterned main surface facing the light transmissive carrier and a second main surface facing away from the light transmissive carrier;

a contact structure comprising a first contact area and a second contact area arranged on the second main surface and a via, wherein the second contact area is electrically connected to the second semiconductor layer, and wherein the via is electrically connected to the first contact area and extends from the second main surface throughout the second semiconductor layer and the active region into the first semiconductor layer;

an insulating layer covering a vertical surface of the semiconductor body, wherein the insulating layer comprises a structured and mechanically broken tether in regions covering the light transmissive carrier, wherein the semiconductor component is free of a growth substrate, and wherein the light transmissive carrier is an interposer or a final board; and a connecting layer fixing the semiconductor body to the light transmissive carrier, wherein the structured and mechanically broken tether is arranged sideways from the semiconductor body and is embedded in the connecting layer.

10. The semiconductor component according to claim 9, wherein, during operation of the semiconductor component, the active region is configured to generate electromagnetic radiation which is coupled out from the semiconductor component at a couple out surface of the light transmissive carrier, the couple out surface being remote from the semiconductor body.

11. The semiconductor component according to claim 9, wherein the semiconductor component has a downward emitting configuration and the semiconductor body is arranged on the light transmissive carrier such that its radiation passage area faces the light transmissive carrier and a radiation passage area of the semiconductor component is formed by a surface of the light transmissive carrier, the surface of the light transmissive carrier being remote from the semiconductor body.

12. The semiconductor component according to claim 9, further comprising a first mirror layer and a second mirror layer, wherein the first mirror layer is arranged on a side of the semiconductor body facing the second main surface, wherein the second mirror layer is embedded into the light transmissive carrier and is arranged sideways from the semiconductor body, and wherein, in a top view, the first mirror layer and the second mirror layer do not overlap.

13. The semiconductor component according to claim 9, wherein phosphor particles are disposed within the light transmissive carrier.

14. The semiconductor component according to claim 9, wherein phosphor particles are arranged in a layer disposed on the light transmissive carrier.

15. A device comprising:
a plurality of the semiconductor components according to claim 9, wherein the light transmissive carriers of the semiconductor components are formed as a single common light transmissive carrier.

16. A semiconductor component comprising:
a light transmissive carrier;
a semiconductor body disposed on the light transmissive carrier, the semiconductor body comprising a first semiconductor layer, a second semiconductor layer and an active region being arranged between the first semiconductor layer and the second semiconductor layer, wherein the semiconductor body comprises a first patterned main surface facing the light transmissive carrier and a second main surface facing away from the light transmissive carrier;

a contact structure comprising a first contact area and a second contact area arranged on the second main surface and a via, wherein the second contact area is electrically connected to the second semiconductor layer, and wherein the via is electrically connected to the first contact area and extends from the second main surface throughout the second semiconductor layer and the active region into the first semiconductor layer;

an insulating layer covering a vertical surface of the semiconductor body, wherein the insulating layer comprises a structured and mechanically broken tether in regions covering the light transmissive carrier, wherein the semiconductor component is free of a growth substrate, and wherein the light transmissive carrier is an interposer or a final board; and a connecting layer mechanically fixing the semiconductor body to the light transmissive carrier, wherein the structured and mechanically broken tether is embedded in the connecting layer, wherein the structured and mechanically broken tether is arranged sideways from the semiconductor body, and wherein the structured and mechanically broken tether is an additional lateral anchoring structure that enhances a mechanical stability of a connection between the light transmissive carrier and the semiconductor body.

17. The semiconductor component according to claim 16, wherein the active region is configured to generate electromagnetic radiation during operation of the semiconductor component.

18. The semiconductor component according to claim 16, wherein phosphor particles are disposed within the light transmissive carrier.

19. The semiconductor component according to claim 16, wherein phosphor particles are in a layer disposed on the light transmissive carrier.

20. The semiconductor component according to claim 16, wherein the light transmissive carrier is an interposer or a final board, wherein, during operation of the semiconductor component, the active region is configured to generate electromagnetic radiation which is coupled out from the semiconductor component at a couple out surface of the light transmissive carrier, the couple out surface being remote from the semiconductor body.

* * * * *